(12) United States Patent
Goel

(10) Patent No.: US 8,694,872 B2
(45) Date of Patent: Apr. 8, 2014

(54) EXTENDED BIDIRECTIONAL HAMMING CODE FOR DOUBLE-ERROR CORRECTION AND TRIPLE-ERROR DETECTION

(75) Inventor: Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 211 days.

(21) Appl. No.: 13/305,126

(22) Filed: Nov. 28, 2011

(65) Prior Publication Data
US 2013/0139028 A1     May 30, 2013

(51) Int. Cl.
*H03M 13/19*     (2006.01)

(52) U.S. Cl.
USPC .......................................... 714/777

(58) Field of Classification Search
USPC ............................. 714/746, 777, 799
See application file for complete search history.

(56) References Cited

U.S. PATENT DOCUMENTS

| | | | |
|---|---|---|---|
| 4,117,458 A | 9/1978 | Burghard et al. | |
| 4,509,172 A | 4/1985 | Chen | |
| 4,556,977 A | 12/1985 | Olderdissen et al. | |
| 5,754,562 A | 5/1998 | Chen | |
| 7,243,293 B2 | 7/2007 | Chen | |
| 7,278,085 B1 * | 10/2007 | Weng et al. | 714/766 |
| 2006/0041826 A1 * | 2/2006 | Bhattacharya et al. | 714/782 |
| 2007/0136644 A1 * | 6/2007 | Katagiri | 714/777 |
| 2009/0271686 A1 * | 10/2009 | Jiang et al. | 714/784 |
| 2010/0205513 A1 * | 8/2010 | Hou et al. | 714/785 |
| 2012/0117448 A1 * | 5/2012 | Kern et al. | 714/785 |
| 2013/0061115 A1 * | 3/2013 | Imai et al. | 714/763 |

* cited by examiner

*Primary Examiner* — Ajay Bhatia
*Assistant Examiner* — Thien D Nguyen
(74) *Attorney, Agent, or Firm* — John R. Pessetto; Wade J. Brady, III; Frederick J. Telecky, Jr.

(57) ABSTRACT

An embodiment of the invention provides a method of correcting 2 bits and detecting three bit using an extended bidirectional Hamming code. A data word with length $K=2^{m-1}$ is received. A code word with length $N=2^{m-1}+2m+1$ is generated from the data word in accordance with the extended bidirectional Hamming code defined by the following parity check matrix:

$$H = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix}.$$

The number of parity bit is given by (2m+1).

22 Claims, 3 Drawing Sheets

EXTENDED BIDIRECTIONAL HAMMING CODE FOR DOUBLE-ERROR CORRECTION AND TRIPLE-ERROR DETECTION

BACKGROUND

Error detection and error correction are techniques that enable reliable delivery of digital data. Error detection techniques allow detecting such errors while error correction enables reconstruction of the original data. Errors in digital data may occur during transmission of digital data over a communications channel or may occur in a memory element. For example, the failure of on-chip non-volatile memory cells is increasing in part due to the small feature sizes used in the fabrication of integrated circuit.

Because memory cells are becoming unreliable, data stored (written) into memory is often encoded before the data is stored in memory. The encoding of the data creates extra bits that are also stored in memory. These extra bits are then used to detect and/or correct errors in the data read from the memory.

There are several ways that information (addresses, data, commands, responses) may be encoded to correct error(s) that occur. For example, an Error Correcting Code (ECC) may be used. ECC is a code in which data being transmitted or written conforms to specific rules of construction so that departures from this construction in the received or read data may be detected and/or corrected. Some ECC codes can detect a certain number of bit errors and correct a smaller number of bit errors. Codes which can correct one error are termed single error correcting (SEC), and those which detect two are termed double error detecting (DED). A Hamming code, for example, may correct single-bit errors and detect double-bit errors (SEC-DED). More sophisticated codes correct and detect even more errors. Examples of error correction code include Hamming code, Reed-Solomon code, Reed-Muller code and Binary Golay code.

Additional circuitry is needed to implement ECC on an integrated circuit. The additional circuitry increases the time required to write and read data to and from a memory array. Increasing the times to read and write to a memory array can slow the performance of an integrated circuit. Therefore it is important to keep the increase in time due to additional circuitry being added for ECC to a minimum.

DETAILED DESCRIPTION

Figure 1:
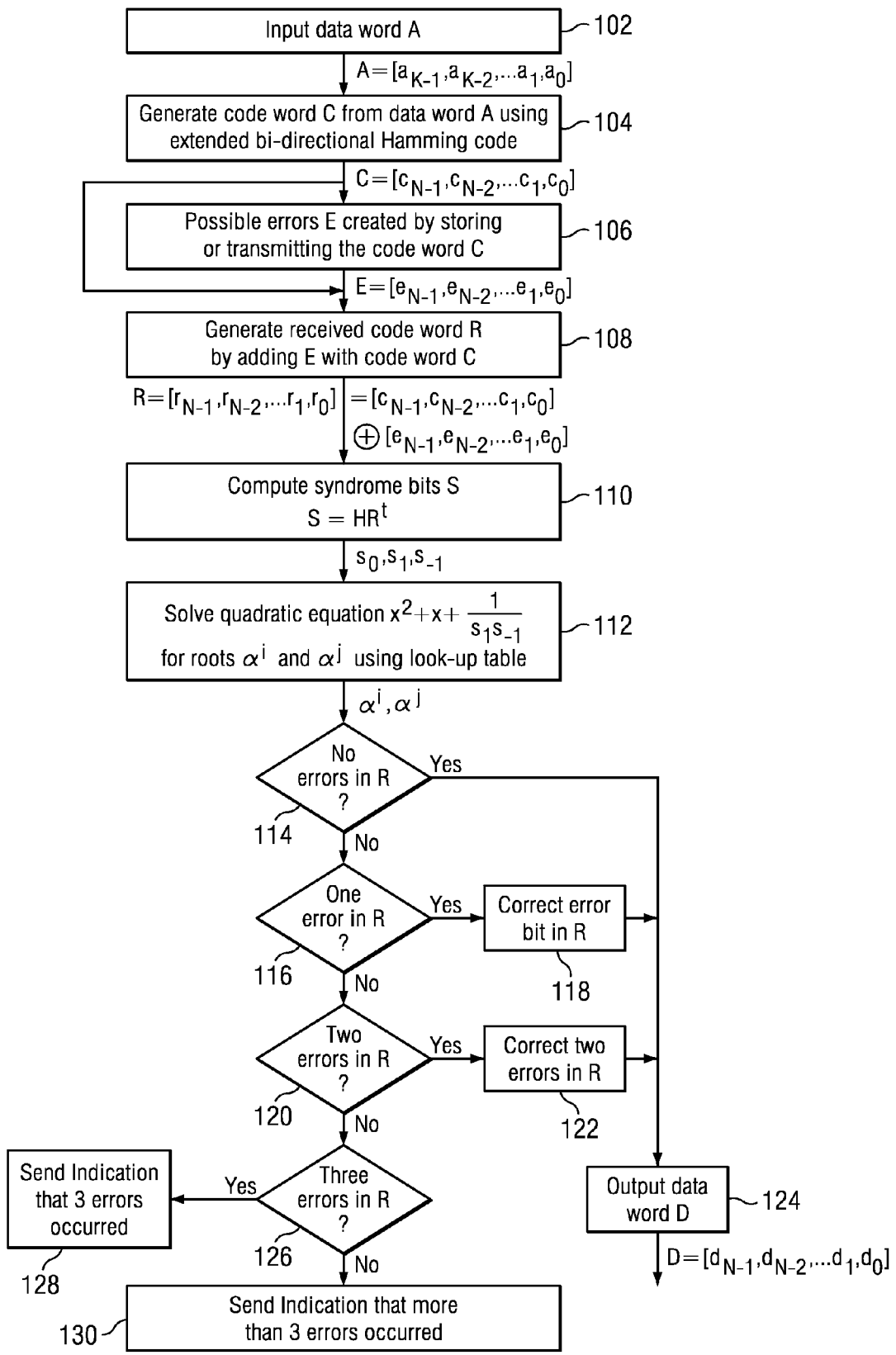
FIG. 1 is a block diagram illustrating a method of encoding and decoding a data word using an embodiment of the invention.

The drawings and description, in general, disclose a method and apparatus for encoding and decoding a data word such that one and two bit errors can be corrected and three bit errors can be detected. A data word A with length $K=2^{m-1}$ bits is encoded as follows. A code word C with length $N=2^{m-1}+2m+1$ bits is generated from the data word A in accordance with an embodiment of the invention defined by the following parity check matrix equation:

$$HC^t = 0 \text{ where}$$

$$H = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix}.$$

The symbol $\alpha$ is an m-bit root of a primitive polynomial. The symbol is also one of the elements of a Galois Field of size $2^m$. $C^t$ is the transpose of the code word C. The number of parity bit is given by (2m+1).

After the code word is either stored or transmitted electronically, the received code word is decoded for errors. To determine whether the received word accurately represents the original code word, the received word R is used to generate a k-bit syndrome vector S using a matrix transformation of the form:

$$S = HR^t$$

where $R^t$ is the transpose of the received word R. The syndrome vector S is independent of the original code word C and a function only of the error vector E since C and R are related by R=C+E. A decoder uses the syndrome vector S to reconstruct the error vector E, which is subtracted from the received word R to regenerate the code word C.

A branch in mathematics known as Galois field (GF) theory deals mainly with the analysis and formal description of binary operations upon polynomials. The binary extensions of Galois fields ($GF(2^m)$) are used extensively in digital logic circuitry. Addition and multiplication are common Galois operations. Multiplication in a finite field, such as a Galois field, is multiplication modulo a polynomial value used to define the finite field (i.e., it is multiplication followed by division using the polynomial value as the divisor). Operations upon elements in Galois fields are accomplished via bitwise operations such as XOR, AND, and OR operations. A bitwise operation operates on one or more bit patterns or binary numerals at the level of their individual bits. "ANDing", XORing", "ORing" etc. refers to performing bitwise logical operations such as AND, XOR or OR logical operations on bit patterns.

A code is a set of code words C generated from a given set of data words A. Codes can be classified by the number of symbols k in a data word A where $k=2^{m-1}$. For example, a data word may be expressed by:

$$A = [a_{K-1}, a_{K-2}, \ldots a_1, a_0]$$

or by a polynomial expression:

$$a(x) = a_{K-1}x^{K-1} + a_{K-2}x^{K-2} + \ldots + a_1 x + a_0(x).$$

Often, codes words C are constructed by appending a party word B with n-k check symbols (i.e. check bits) to the K message symbols to form an n-symbol code word C. The code word C is formed using a linear matrix transformation:

$$C = AG$$

where $C = [c_{N-1}, c_{N-2}, \ldots, c_1, c_0]$ is a 1×n row vector representing the n-symbol code word and G is a k×n matrix known as a generator matrix. The generator may also be expressed as a polynomial equation g(x). The parity word B may be expressed as a polynomial $b(x) = \mathrm{mod}(x^{2m+1} a(x), g(x))$.

Although the symbols need not be bits, they are usually bits. In the following description, the symbols will be referred to as bits of an electronic storage medium or bits in an electronic communication channel.

An n-bit received code word R may be retrieved either from an electronic storage medium or received over an electronic communications channel. The received code word R is given by the following equation:

$$R=[r_{N-1}, r_{N-2}, \ldots, r_1, r_0]=[c_{N-1}, c_{N-2}, \ldots, c_1, c_0] \oplus [e_{N-1}, e_{N-2}, \ldots, e_1, e_0].$$

The error vector $E=[e_{N-1}, e_{N-2}, \ldots, e_1, e_0]$ represents any errors that may have occurred either during storage or transmission of the bits in the code word C. To determine whether the received word accurately represents the original code word C, the received word R is used to generate a 2m+1-bit syndrome vector S using a matrix transformation of the form:

$$S=HR^t$$

where $R^t$ is the transpose of an 1×N vector R.

The syndrome vector S is independent of the original code word C and a function only of the error vector E. A decoder uses the syndrome vector S to reconstruct the error vector E, which is subtracted from the received word R to regenerate the code word C.

A code is able to detect and correct errors based on the "Hamming distance" between words of the code. The Hamming distance between two code words is the number of symbols in which the two code words differ. When the minimum Hamming distance of a code is t+1, then the code can detect up to t errors. When the minimum Hamming distance of a code is 2t+2, the code can correct up to t errors and can also detect t+1 errors.

In order to correct two errors and detect three errors, a Hamming code must have a minimum Hamming distance of 6 symbols. This type of code is usually referred to as double error correcting and triple error detecting (DEC-TED) code. Error correction codes capable of correcting double errors and detecting triple errors can be constructed based on the BCH (Bose-Chaudhuri-Hocquenghem) theory. A primitive BCH DEC-TED code of length n=$2^m$−1 with 2m+1 check bits is obtained with a parity check matrix, each column vector k of which consists of 1, $\alpha^k$ and $\alpha^{3k}$, where $\alpha$ is a primitive element of the finite field of $2^m$ elements.

An embodiment of the invention includes a code with double error correction and triple error detection for a data word A of length K=$2^{m-1}$ bits. The code is called an Extended Bidirectional Hamming code (EBHC). A code word C may be constructed using a parity check matrix having the following form:

$$HC^t = 0 \text{ where}$$

$$H = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix}.$$

The finite field element a in the above matrix is root of an irreducible polynomial over the Galois field GF($2^m$). The Galois field primitive polynomial is given by:

$$p(x)=p_m x^m + p_{m-1} x^{m-1} + \ldots + p_1 x + p_0$$

This Galois field primitive polynomial is a polynomial of degree m having binary coefficients. The generator polynomial g(x) for the Extended Bidirectional Hamming code is defined as:

$$g(x)=(x+1)p(x)\tilde{p}(x)$$

where $\tilde{p}(x)=p_0 x^m + p_1 x^{m-1} + \ldots + p_{m-1} x + p_0$.

A data word $A=[a_{K-1}, a_{K-2}, \ldots, a_1, a_0]$ is represented by a polynomial:

$$a(x)=a_{K-1} x^{K-1} + a_{K-2} x^{K-2} + \ldots + a_1 x + a_0.$$

Parity word $B=[b_{2m}, b_{2m-1}, \ldots, b_1, b_0]$ has a code length of 2m+1 and is represented by polynomial:

$$b(x)=b_{2m} x^{2m} + b_{2m-1} x^{2m-1} + \ldots + b_1 x + b_0.$$

b(x) is derived using the following equation $$b(x)=\text{mod}(x^{2m+1} a(x)+b(x)).$$

The encoded word $C=[c_{N-1}, c_{N-2}, \ldots, c_1, c_0]$ is represented by a polynomial:

$$c(x)=x^{2m+1} a(x)+b(x).$$

The polynomial expression for the encoded word C shown above has roots at 5 consecutive powers, −2, −1, 0, 1, 2, of the Galois field primitive element a (i.e. $\alpha^{-2}, \alpha^{-1}, \alpha, \alpha^1, \alpha^2$). Because the polynomial expression for the encoded word C shown above has roots at 5 consecutive powers, the extended bidirectional Hamming code has a minimum distance of six. Since the extended bidirectional Hamming code has a minimum distance of six, this code may be used to correct single and double errors and detect three errors.

As an example of the use of the extended bidirectional Hamming code, assume that a data word A has a length of 64 bits (i.e. K=64). Since K=64, m=7 because K=$2^{m-1}$. Because N=$2^{m-1}$+2m+1 is number of bits in the coded word, N=79 and because the number of parity bits is given by 2m+1, the number of parity bits is 15. In this example, party check matrix is given by:

$$H = \begin{bmatrix} 1 & 1 & \ldots & 1 \\ 1 & \alpha & \ldots & \alpha^{78} \\ 1 & \alpha^{-1} & \ldots & \alpha^{-78} \end{bmatrix}.$$

Also, when the primitive polynomial is p(x)=$x^7$+x+1 then g(x) is given by:

$$g(x)=x^{15}+x^{13}+x^9+x^6+x^2+1$$

The code word $C=[c_{N-1}, c_{N-2}, \ldots, c_1, c_0]$ may be stored in electronic memory. Electronic memory may be corrupted for many reasons. For example, an alpha particle may strike the memory and change the digital value of the stored information. In addition, the code word $C=[c_{N-1}, c_{N-2}, \ldots, c_1, c_0]$ may also be transmitted through a noisy environment that may also change the digital value of C. Because the code word C is encoded, some of these errors may be corrected and some of the errors may be detected as explained previously.

When the code word C is either received from a memory or received as a transmission, a decoder may be used to determine if 1, 2 or 3 errors have occurred. In addition, the decoder may be used to determine where the 1 or 2 errors have occurred. The decoder may also be used to correct 1 or 2 errors. The received code word R is:

$$R=[r_{N-1}, r_{N-2}, \ldots, r_1, r_0]=[c_{N-1}, c_{N-2}, \ldots, c_1, c_0] \oplus [e_{N-1}, e_{N-2}, \ldots, e_1, e_0].$$

The error vector E is given by:

$$E=[e_{N-1}, e_{N-2}, \ldots e_1, e_0].$$

Syndrome bits S are used to detect and correct errors in the received word R. The syndrome bits S are calculated as follows:

$$\begin{bmatrix} S_0 \\ S_1 \\ S_{-1} \end{bmatrix} = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix} \begin{bmatrix} r_0 \\ r_1 \\ \vdots \\ r_{N-1} \end{bmatrix}$$

where $S_0$ is a one-bit syndrome and $S_1$ and $S_{-1}$ are m-bit syndromes at two roots computed via evaluation of the received code word $R=[r_{N-1}, r_{N-2}, \ldots, r_1, r_0]$ at $x=1$, $x=\alpha$ and $x=\alpha^{-1}$.

In the case where no errors occur, all three syndrome bits are equal to zero (i.e. $S_0=0$, $S_1=0$ and $S_{-1}=0$). The received code word R has no errors with weights up to 3. In the case where no errors occur, the received code word R is copied to the output of the decoder without any modifications.

In the case where one error occurs, the three syndrome bits are as follows:

$S_0=1$ $S_1=\alpha^j$ $S_{-1}=\alpha^{-j}$

Please note that this condition is detected via $S_1 S_{-1}=1$ and $S_0=1$. Given the received code word $R=[r_{N-1}, r_{N-2}, \ldots r_1, r_0]$ and error location $\alpha^j$, the decoder will correct bit $r_k$ ($k=0, 1 \ldots N-1$) by inverting bit $r_k$ when $\alpha^j=\alpha^k$. After the received bit $r_k$ in code word R is corrected, code word R is copied to the output of the decoder.

In the case where two errors occur, the three syndrome bits are as follows:

$S_0=0$ $S_1=\alpha^i+\alpha^j$ $S_{-1}=\alpha^{-i}+\alpha^{-j}$

Two errors are located at $\alpha^i$, and $\alpha^j$ can be computed by following the following quadratic equation:

$x^2+x+1/(S_1 S_{-1})=0$ where $x_1$ is a root of the above equation. The two error locations are given by:

$\alpha^i=x_1 S_1$ and $\alpha^j=S_1+\alpha^i$

Figure 4:
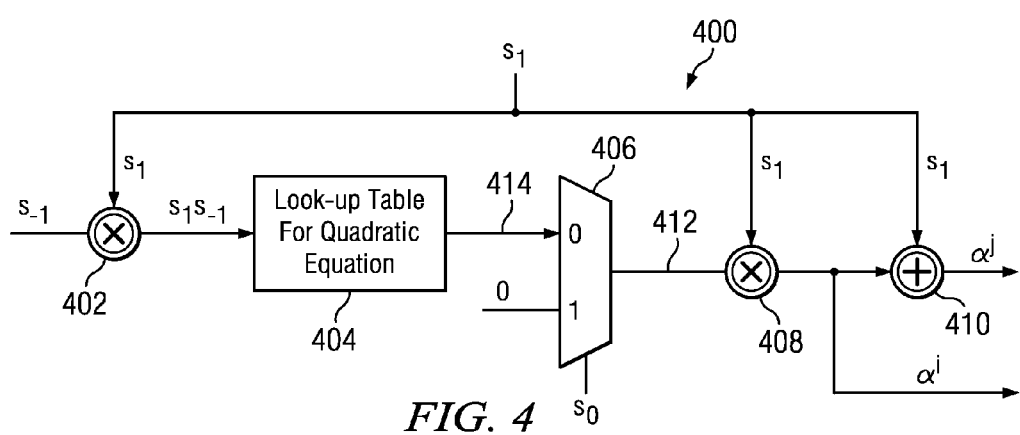
FIG. 4 is a block diagram of an embodiment of a circuit for locating errors in a received word from syndrome bits.

Note that solution to quadratic equation, $x^2+x+1/(S_1 S_{-1})=0$, can be stored as a look up table storing two roots given the third term as function of syndromes (See FIG. 4). One special case occurs when $S_1 S_{-1}=1$ (same condition as the single error case) and m is an even value, the double error locations may be found by solving the following equation:

$x^2+x+1=0$.

It can be shown that above equation has solution only if m is even and solution is given by $$x_1 = \alpha^{\left(\frac{2^m-1}{3}\right)}$$

$$x_2 = \alpha^{2\left(\frac{2^m-1}{3}\right)}$$

To resolve this condition with the single error case, $S_0$ is used (i.e. if $S_0=1$ then there is a single error and if $S_0=0$ then there are two errors). This situation does not arise in the case where m is odd. Therefore, in an embodiment of the invention a double error correcting code may be designed with parity of 2m bits for odd values of m without adding even parity row to the parity check matrix. This embodiment will be explained in more detail later in the specification.

In another embodiment, a double error correcting and a triple error detecting code may be created by adding an additional parity row, $[1, 1 \ldots, 1]$ as defined in the definition of the parity check matrix. However, for even values of m, a minimum parity of 2m+1 bits is needed to handle the double error correction case. The embodiment of the code with 2m+1 bits can provide both double error correction as well as triple error detection.

Given the received code word $R=[r_{N-1}, r_{N-2}, \ldots, r_1, r_0]$ and error locations $\alpha^i$ and $\alpha^j$ the decoder will correct bits $r_k$ ($k=0, 1 \ldots N-1$) by inverting bit $r_k$ when $\alpha^i=\alpha^k$ or $\alpha^j=\alpha^k$. After the received bits $r_k$ in code word R are corrected, code word R is copied to the output of the decoder.

In the case where three errors occur, the three syndrome bits are as follows:

$S_0=1$ $S_1 S_{-1} \neq 1$.

In this case, the received code word R is copied to the output of the decoder and a signal is generated that indicates that three errors have occurred.

FIG. 1 is a block diagram illustrating a method of encoding and decoding a data word using an embodiment of the invention. During step 102, a data word $A=[a_{K-1}, a_{K-2}, \ldots, a_1, a_0]$ is input to an encoder. The encoder, during step 104, generates code word $C=[c_{N-1}, c_{N-2}, \ldots, c_1, c_0]$ from data word A. Errors $E=[e_{N-1}, e_{N-2}, \ldots e_1, e_0]$ may occur in the code word C during storage or transmission (step 106) of the code word C. The error(s) E that occur during storage or transmission of code word C are added to the code word C during step 108 creating received code word $R=[r_{N-1}, r_{N-2}, \ldots, r_1, r_0]=[c_{N-1}, c_{N-2}, \ldots, c_1, c_0] \oplus [e_{N-1}, e_{N-2}, \ldots, e_1, e_0]$.

Decoding of the received code word R begins with step 110. During step 110, syndrome bits (e.g. syndrome vector) S are generated as follows:

$$\begin{bmatrix} S_0 \\ S_1 \\ S_{-1} \end{bmatrix} = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix} \begin{bmatrix} r_0 \\ r_1 \\ \vdots \\ r_{N-1} \end{bmatrix}.$$

$S_0$ is a one-bit syndrome and $S_1$ and $S_{-1}$ are m-bit syndromes at two roots computed via evaluation of the received code word R. During step 112, the roots $\alpha^j$ and $\alpha^i$ of quadratic equation $X^2+X+1/(S_1 S_{-1})=0$ are solved for using a look-up table.

After the quadratic equation is solved, the method, during step 114, determines whether any errors have occurred in the received code word R. No errors occur in the received code word R when $S_0$, $S_1$ and $S_{-1}$ all are equal to zero. When no errors occur in the received code R, the data word $D=[d_{N-1}, d_{N-2}, \ldots d_1, d_0]$ is output as $D=R$ (see FIG. 5).

During step 116 if there is one error in the received code word R, that error bit is corrected in step 118 and the data word D is output with no errors. One error occurs when $S_0=1$, $S_1=\alpha^j$ and $S_{-1}=\alpha^{-j}$. During step 120 if there are two errors in the received code word R, these error bits are corrected in step 122 and the data word D is output with no errors. Two errors occur when $S_0=0$, $S_1=\alpha^i+\alpha^j$ and $S_{-1}=\alpha^{-i}+\alpha^{-j}$.

During step 126 if there are three errors in the received code word R, no data word D is output and an indication, 128, that three errors occurred is output. When three or more errors occur, no errors are corrected and an indication, 130, is output that more than tree errors occurred.

Figure 2:
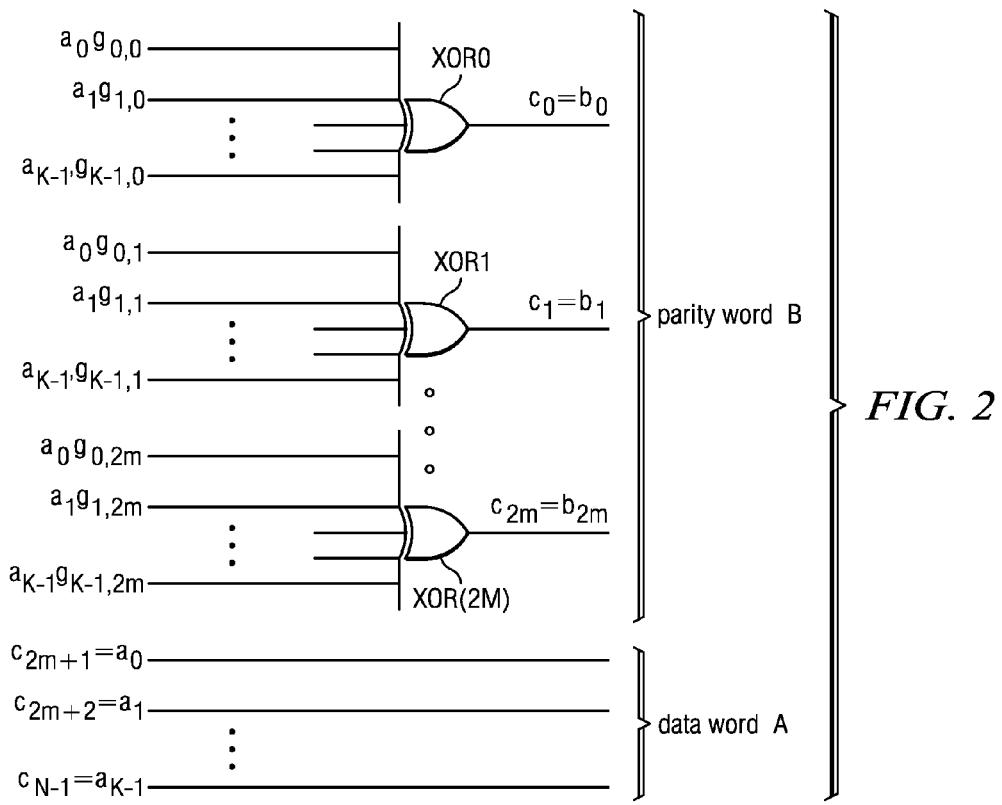
FIG. 2 is a schematic drawing of an embodiment of a code word generator using bit-wise XOR gates.

FIG. 2 is a schematic drawing of an embodiment of a code word generator using XOR gates. In this example, the parity word $B=[b_{2m}, b_{2m-1}, \ldots, b_1, b_0]$ is generated on a bit-wise basis. The parity word B is given by $b(x)=\mod(x^{2m+1}a(x),g(x))$. The operation can also be represented in vector format as $$C=AG,$$

where G is the generator matrix of size k×n. Elements of G are obtained from g(x) where the first row of G is computed as $\mod(x^{k+2m},g(x))$, the second row of G is computed as $\mod(x^{k+2m-1},g(x))$, the third row of G is computed as $\mod(x^{k+2m-2},g(x))$, and so on, with the $k^{th}$ row of G computed as $\mod(x^{2m+1},g(x))$, and in general, the $j^{th}$ row computed as $\mod(x^{k+2m+1-j},g(x))$ where $j=1, 2, 3, \ldots k$. Now, code word C is obtained via vector-matrix multiplication of A and G.

In this embodiment, exclusive OR function XOR0 applies the products of A*G on a bit-wise basis for column 0 with the output being equal to $b_0$ ($b_0$ is also equal to $C_0$ of the code word C). Exclusive OR function XOR1 applies the products of A*G on a bit-wise basis for column 1 with the output being equal to $b_1$ ($b_1$ is also equal to $C_1$ of the code word C). Each subsequent XOR repeats this pattern until the last parity bit, 2m, is created. Exclusive OR function XOR2m applies the products of A*G on a bit-wise basis for column 2m with the output being equal to $b_{2m}$ ($b_{2m}$ is also equal to $C_{2m}$ of the code word C).

Code word bits $C_{2m+1}$ through $C_{N-1}$ are simply equal to data word bits $a_0$ through $a_{k-1}$.

Figure 3:
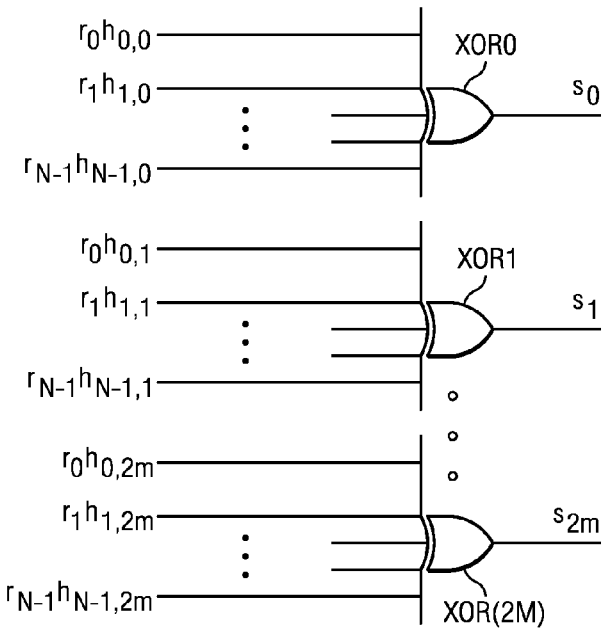
FIG. 3 is a schematic drawing of an embodiment of a syndrome bit generator using bit-wise XOR gates.

FIG. 3 is a schematic drawing of an embodiment of a syndrome bit generator using bit-wise XOR gates. In this example, the syndrome bits (syndrome vector) S are generated on a bit-wise basis. The syndrome bits are given by:

$$\begin{bmatrix} S_0 \\ S_1 \\ S_{-1} \end{bmatrix} = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix} \begin{bmatrix} r_0 \\ r_1 \\ \vdots \\ r_{N-1} \end{bmatrix}.$$

In this embodiment, exclusive OR function XOR0 applies the products of $H*R^t$ on a bit-wise basis for column 0 with the output being equal to $S_0$. Exclusive OR function XOR1 applies the products of A*G on a bit-wise basis for column 1 with the output being equal to $S_1$. Each subsequent XOR repeats this pattern until the syndrome bit, $S_{2m}$, is created. Exclusive OR function XOR2m applies the products of $r(x)*h(x)$ on a bit-wise basis for column 2m with the output being equal to $S_{2m}$.

FIG. 4 is a block diagram of an embodiment of a circuit for locating errors in a received word from syndrome bits. In this example, syndrome bit $S_1$ and syndrome bit $S_{-1}$ are multiplied by a Galois field multiplier 402. The product, $S_1S_{-1}$, is then input into a look-up table 404. The look-up table 404 solves the following quadratic equation:

$$x^2+x+1/(S_1S_{-1})=0.$$

The solution, $x_1$ to the above equation is output to node 414 and an input of the multiplexer 406. The other input to the multiplexer 406 is a logical zero.

When a single error occurs, $S_0=1$, the multiplexer outputs to node 412 a logical zero. The logic zero is multiplied by $S_1$ by Galois field multiplier 408 giving a logical zero for $\alpha^j$. The Galois field adder 410 adds the logical zero to $S_1$. As a result, $S_1=\alpha^j$ and $S_{-1}=\alpha^{-j}$.

When a double error occurs, $S_0=0$, $x_1$ is transferred to node 412 from node 414. $x_1$ is then multiplied by $S_1$ by Galois field multiplier 408 giving with the following result for $\alpha^i$:

$$\alpha^i=x_1S_1.$$

$\alpha^i$ is then added by Galois field adder 410 to $S_1$ with the following result for $\alpha^j$:

$$\alpha^j=S_1+\alpha^i.$$

Figure 5:
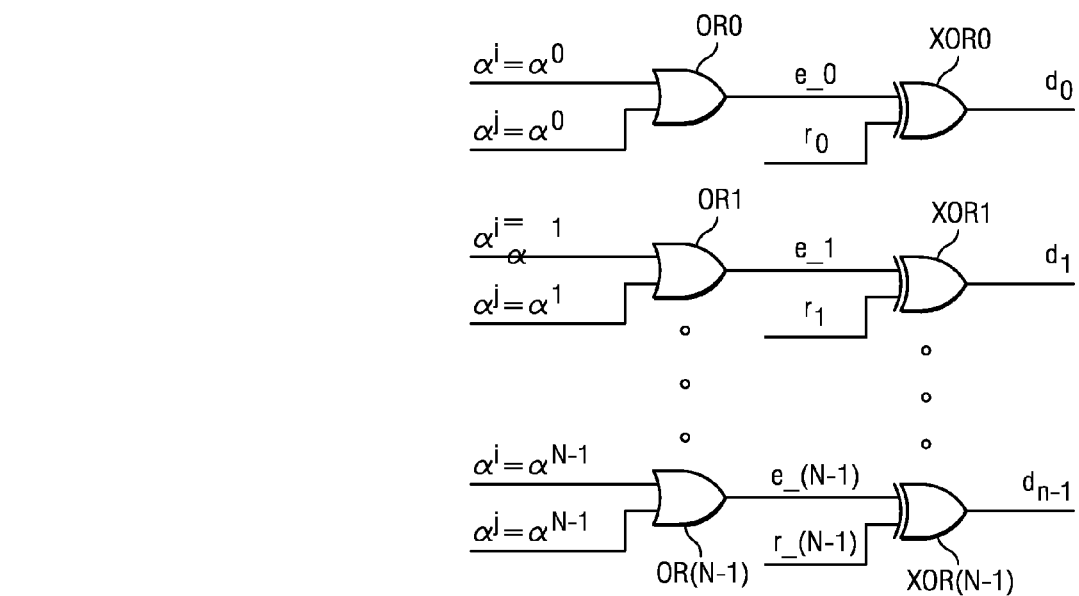
FIG. 5 is a schematic drawing of an embodiment of logic for correcting one and two error in a received code word.

FIG. 5 is a schematic drawing of an embodiment of logic for correcting one and two error in a received code word. In this embodiment two-input OR gates and two-input XOR gates are used in a bit-wise manner. $\alpha^i$ and $\alpha^j$ are connected to the two inputs of the OR gates, OR0-OR(N−1). The outputs $\alpha^0-\alpha^{N-1}$ are electrically connected to inputs of the two-input XOR gates XOR0-XOR(N−1). The other inputs of the two-input XOR gates XOR0-XOR(N−1) are connected to received code bits $r_0$-$r_N$. When one or two errors occur in code word $R=[r_{N-1}, r_{N-2}, \ldots, r_1, r_0]$ and the error(s) are located at $\alpha^i$ and $\alpha^j$, the decoder will correct bit $r_k$ ($k=0, 1 \ldots N-1$) by inverting bit $r_k$ when $\alpha^j=\alpha^k$. After the received bit $r_k$ in code word R is corrected, data word $D=[d_{N-1}, d_{N-2}, \ldots d_1, d_0]$ is copied to the output of the decoder.

Because an embodiment of this invention places roots of the code word polynomial at −1, 0 and 1 powers of primitive Galois Field element a instead of using known methods where the roots are placed at 0, 1 and 3 powers of primitive Galois Field element α, the complexity of the decoder is reduced and the delay time of a signal propagating through the decoder is reduced.

Another embodiment of the invention includes a code with double error correction and triple error detection for a data word A of length $K=2^{m-1}$ bits where m is odd. The code is called a Bidirectional Hamming code (BHC). A code word C may be constructed using a parity check matrix having the following form:

$$HC^t = 0 \text{ where}$$

$$H = \begin{bmatrix} 1 & \alpha & \ldots & \alpha^{N-1} \\ 1 & \alpha^{-1} & \ldots & \alpha^{-N+1} \end{bmatrix}.$$

The finite field element a in the above matrix is root of an irreducible polynomial over the Galois field $GF(2^m)$. The Galois field primitive polynomial is given by:

$$p(x)=p_mx^m+p_{m-1}x^{m-1}+\ldots+p_1x+p_0.$$

This Galois field primitive polynomial is a polynomial of degree m having binary coefficients. The length of the code word C is $N=2^{m-1}+2m$ bits and the number of parity bits is given by (2m+1).

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A machine-implemented method of generating a binary code word from a binary data word in accordance with an extended bidirectional Hamming code, comprising:
   receiving the binary data word representing data to be encoded; wherein the length of the binary data word is represented by $K=2^{m-1}$ wherein m is an integer value;
   generating the binary code word from the binary data word in accordance with the extended binary bidirectional Hamming code defined by the following parity check matrix:

$$H = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix}$$

wherein the length of the binary code word is $N=2^{m-1}+2m+1$ bits; and
   wherein the number of parity bits is given by $(2m+1)$.

2. A non-transitory computer readable medium storing one or more sequences of instructions causing a digital processing system to facilitate generating a binary code word from a binary data word, wherein execution of said one or more sequences of instructions by one or more processors contained in said digital processing system causes said digital processing system to perform the actions of:
   receiving the binary data word representing data to be encoded; wherein the length of the binary data word is represented by $K=2^{m-1}$ wherein m is an integer value;
   generating the binary code word from the binary data word in accordance with the extended binary bidirectional Hamming code defined by the following parity check matrix:

$$H = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix}$$

wherein the length of the binary code word is $N=2^{m-1}+2m+1$ bits; and
   wherein the number of parity bits is given by $(2m+1)$.

3. The method of claim 2 wherein K=64, M=7, N=79 such that the length of the binary data word is 64 bits, the length of the binary code word is 79, the number of parity bits is 15 and the parity check matrix H is given by:

$$H = \begin{bmatrix} 1 & 1 & \ldots & 1 \\ 1 & \alpha & \ldots & \alpha^{78} \\ 1 & \alpha^{-1} & \ldots & \alpha^{-78} \end{bmatrix}.$$

4. The method of claim 3 wherein when a Galois field primitive polynominal p(x) equals $x^7+x+x+1$, a generator polynomial g(x) is equal to:

$$x^{15}+x^{13}+x^9+x^6+x^2+1.$$

5. The method of claim 2 further comprising the steps of:
   receiving a binary code word wherein the binary code word C is given by:

$$C=[c_{N-1}, c_{N-2}, \ldots c_1, c_0],$$

wherein error vector E is given by:

$$E=[e_{N-1}, e_{N-2}, \ldots e_1, e_0],$$

wherein the received binary code word is given by:

$$R=[r_{N-1}, r_{N-2}, \ldots, r_1, r_0]=[c_{N-1}, c_{N-2}, \ldots, c_1, c_0] \oplus [e_{N-1}, e_{N-2}, \ldots, e_1, e_0],$$

generating a syndrome vector S wherein the syndrome vector S is given by:

$$\begin{bmatrix} S_0 \\ S_1 \\ S_{-1} \end{bmatrix} = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix} \begin{bmatrix} r_0 \\ r_1 \\ \vdots \\ r_{N-1} \end{bmatrix}$$

wherein $S_0$ is a one-bite syndrome; wherein $S_1$ and $S_{-1}$ are m-bit syndromes.

6. The method of claim 5 wherein $S_1$ and $S_{-1}$ are two roots of the received code word polynomial, $r(x)=r_{N-1}x^{N-1}+r_{N-2}x^{N-2}+\ldots+r_1x+r_0$ when evaluated at x=1, x=$\alpha$, and x=$\alpha^{-1}$.

7. A non-transitory computer readable medium storing one or more sequences of instructions causing a digital processing system to facilitate decoding a binary code word, wherein execution of said one or more sequences of instructions by one or more processors contained in said digital processing system causes said digital processing system to perform the actions of:
   receiving the binary code word wherein the code word C is given by:

$$C=[c_{N-1}, c_{N-2}, \ldots c_1, c_0],$$

wherein error vector E is given by:

$$E=[e_{N-1}, e_{N-2}, \ldots e_1, e_0],$$

wherein the received binary code word is given by:

$$R=[r_{N-1}, r_{N-2}, \ldots, r_1, r_0]=[c_{N-1}, c_{N-2}, \ldots, c_1, c_0] \oplus [e_{N-1}, e_{N-2}, \ldots, e_1, e_0],$$

generating a syndrome vector S wherein the syndrome vector S is given by:

$$\begin{bmatrix} S_0 \\ S_1 \\ S_{-1} \end{bmatrix} = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix} \begin{bmatrix} r_0 \\ r_1 \\ \vdots \\ r_{N-1} \end{bmatrix}$$

wherein $S_0$ is a one-bite syndrome; wherein $S_1$ and $S_{-1}$ are m-bit syndromes;
   analyzing the received binary code word for errors using the syndrome vector S.

8. The method of claim 7 in which the analyzing step comprises the steps of:
   determining when syndrome bits $S_0=0$, $S_1=0$ and $S_{-1}=0$;
   generating an indication that no errors occurred in the received binary code word when syndrome bits $S_0=0$, $S_1=0$ and $S_{-1}=0$.

9. The method of claim 7 in which the analyzing step comprises the steps of:
   determining when syndrome bits $S_0=1$, $S_1=\alpha^i$ and $S_{-1}=\alpha^{-i}$;
   generating an indication that one error occurred in the received binary code word when syndrome bits $S_0=1$, $S_1=\alpha^j$ and $S_{-1}=\alpha^{-j}$.

10. The method of claim 7 in which the analyzing step comprises the steps of:
   determining when syndrome bits $S_0=0$, $S_1=\alpha^i+\alpha^j$ and $S_{-1}=\alpha^{-i}+\alpha^{-j}$;
   generating an indication that two errors occurred in the received binary code word when syndrome bits $S_0=0$, $S_1=\alpha^i+\alpha^j$ and $S_{-1}=\alpha^{-i}+\alpha^{-j}$.

11. The method of claim 7 in which the analyzing step comprises the steps of:
   determining when syndrome bits $S_0=1$ and $S_1 S_{-1} \neq 1$;
   generating an indication that three errors occurred in the received binary code word when syndrome bits $S_0=1$ and $S_1 S_{-1} \neq 1$.

12. The method of claim 9 further comprising the step of:
   correcting the error, wherein correcting the error comprises:
      locating the error bit $r_k$ ($k=0, 1 \ldots N-1$) in the received binary code word $R=[r_{N-1}, r_{N-2}, \ldots, r_1, r_0]$;
      inverting the error bit $r_k$ when $\alpha^j = \alpha^k$.

13. The method of claim 10 further comprising the step of:
   correcting the two errors, wherein correcting the two error comprises:
      locating two error bits $r_k$ ($k=0, 1 \ldots N-1$) in the received binary code word $R=[r_{N-1}, r_{N-2}, \ldots, r_1, r_0]$;
      inverting a first error bit $r_k$ ($k=0, 1 \ldots N-1$) when $\alpha^i = \alpha^k$; and
      inverting a second error bit $r_k$ ($k=0, 1 \ldots N-1$) when $\alpha^j = \alpha^k$.

14. The method of claim 13 wherein locating the two errors comprises:
   solving a quadratic equation wherein the quadratic equation is:

$$x^2 + x + 1/(S_1 S_{-1}) = 0;$$

wherein $\alpha^i = x_1 S_1 \alpha^k$ and $\alpha^j = \alpha^i + S_1$;
   wherein $x_1$ is a root of the quadratic equation.

15. The method of claim 7 in which the analyzing step comprises the steps of:
   determining when syndrome bits $S_0=0$, $S_1 S_{-1}=1$;
   generating an indication that two errors occurred in the received binary code word when syndrome bits $S_0=0$, $S_1 S_{-1}=1$;
   locating the two errors wherein locating the two errors comprises:
      solving a quadratic equation wherein the quadratic equation is:

$$x^2 + x + 1 = 0;$$

wherein $x_1$ and $x_2$ are roots for the quadratic equation wherein:

$$x_1 = \alpha^{\left(\frac{2^m-1}{3}\right)}$$
   $$x_2 = \alpha^{2\left(\frac{2^m-1}{3}\right)}.$$

16. An apparatus for generating a binary code word from a binary data word in accordance with an extended binary bidirectional Hamming code, comprising:
   an encoder for receiving the binary data word and generating the binary code word from the binary data word in accordance with the extended binary bidirectional Hamming code defined by the following parity check matrix:

$$H = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix}$$

wherein the length of the data word is represented by $K = 2^{m-1}$ wherein m is an integer value;
   wherein the length of the binary code word is $N = 2^{m-1} + 2m + 1$ bits; and
   wherein the number of parity bits is given by ($2m+1$).

17. The apparatus of claim 16 further comprising:
   a syndrome generator for receiving a binary code word wherein the binary code word C is given by:

$$C = [c_{N-1}, c_{N-2}, \ldots c_1, c_0],$$

wherein error vector E is given by:

$$E = [e_{N-1}, e_{N-2}, \ldots e_1, e_0],$$

wherein the received binary code word is given by:

$$R = [r_{N-1}, r_{N-2}, \ldots, r_1, r_0] = [c_{N-1}, c_{N-2}, \ldots, c_1, c_0] \oplus [e_{N-1}, e_{N-2}, \ldots, e_1, e_0],$$

wherein the syndrome generator generates a syndrome vector S wherein the syndrome vector S is given by:

$$\begin{bmatrix} S_0 \\ S_1 \\ S_{-1} \end{bmatrix} = \begin{bmatrix} 1 & 1 & \ldots & 1 \\ 1 & \alpha & \ldots & \alpha^{N-1} \\ 1 & \alpha^{-1} & \ldots & \alpha^{-N+1} \end{bmatrix} \begin{bmatrix} r_0 \\ r_1 \\ \vdots \\ r_{N-1} \end{bmatrix}$$

wherein $S_0$ is a one-bite syndrome; wherein $S_1$ and $S_{-1}$ are m-bit syndromes;
   a syndrome decoder for analyzing the received code word for errors using the syndrome vector S.

18. The apparatus of claim 17 in which the syndrome decoder comprises:
   single error location logic for determining when syndrome bits $S_0=1$, $S_1=\alpha^j$ and $S_{-1}=\alpha^{-j}$, generating an indication that one error occurred in the received binary code word when syndrome bits $S_0=1$, $S_1=\alpha^j$ and $S_{-1}=\alpha^{-j}$, and correcting the error bit $r_k$ ($k=0, 1 \ldots N-1$) in the received binary code word $R=[r_{N-1}, r_{N-2}, \ldots, r_1, r_0]$ by inverting the error bit $r_k$ when $\alpha^j = \alpha^k$.

19. The apparatus of claim 17 in which the syndrome decoder comprises:
   double error location logic for determining when syndrome bits $S_0=0$, $S_1=\alpha^i+\alpha^j$ and $S_{-1}=\alpha^{-i}+\alpha^{-j}$, generating an indication that two errors occurred in the received binary code word when syndrome bits $S_0=0$, $S_1=\alpha^i+\alpha^j$ and $S_{-1}=\alpha^{-i}+\alpha^{-j}$, and correcting the error bits $r_k$ ($k=0, 1 \ldots N-1$) in the received binary code word $R=[r_{N-1}, r_{N-2}, \ldots, r_1, r_0]$ by inverting a first error bit $r_k$ ($k=0, 1 \ldots N-1$) when $\alpha^i = \alpha^k$; and inverting a second error bit $r_k$ ($k=0, 1 \ldots N-1$) when $\alpha^j = \alpha^k$.

20. The apparatus of claim 17 in which the syndrome decoder comprises:
   triple error detection logic for determining when syndrome bits $S_0=1$ and $S_1 S_{-1} \neq 1$ and generating an indication that three errors occurred in the received code word when syndrome bits $S_0=1$ and $S_1 S_{-1} \neq 1$.

21. A machine-implemented method of generating a binary code word from a binary data word in accordance with a binary bidirectional Hamming code, comprising:

receiving the binary data word representing data to be encoded; wherein the length of the binary data word is represented by $K=2^{m-1}$ wherein m is odd;

generating the binary code word from the binary data word in accordance with the extended binary bidirectional Hamming code defined by the following parity check matrix:

$$H = \begin{bmatrix} 1 & \alpha & \ldots & \alpha^{N-1} \\ 1 & \alpha^{-1} & \ldots & \alpha^{-N+1} \end{bmatrix};$$

wherein the length of the binary code word is $N=2^{m-1}+2m$ bits; and wherein the number of parity bits is given by 2m.

22. A non-transitory computer readable medium storing one or more sequences of instructions causing a digital processing system to facilitate generating a binary code word from a binary data word, wherein execution of said one or more sequences of instructions by one or more processors contained in said digital processing system causes said digital processing system to perform the actions of:

receiving the binary data word representing data to be encoded; wherein the length of the data word is represented by $K=2^{m-1}$ wherein m is an integer value;

generating the binary code word from the binary data word in accordance with the extended binary bidirectional Hamming code defined by the following parity check matrix:

$$H = \begin{bmatrix} 1 & \alpha & \ldots & \alpha^{N-1} \\ 1 & \alpha^{-1} & \ldots & \alpha^{-N+1} \end{bmatrix};$$

wherein the length of the code binary word is $N=2^{m-1}+2m$ bits; and wherein the number of parity bits is given by 2m.

* * * * *